(12) United States Patent
Seo et al.

(10) Patent No.: US 11,081,374 B2
(45) Date of Patent: Aug. 3, 2021

(54) SEMICONDUCTOR PACKAGE MOLDING DEVICE AND METHOD OF MANUFACTURING SEMICONDUCTOR DEVICE

(71) Applicant: Samsung Electronics Co., Ltd., Suwon-si (KR)

(72) Inventors: Hee Ju Seo, Asan-si (KR); Jae Won Choi, Cheonan-si (KR); Sung Bok Hong, Cheonan-si (KR); Young Jin Hwang, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 16/401,558

(22) Filed: May 2, 2019

(65) Prior Publication Data

US 2020/0075363 A1 Mar. 5, 2020

(30) Foreign Application Priority Data

Aug. 29, 2018 (KR) .......................... 10-2018-0101936

(51) Int. Cl.
*H01L 21/67* (2006.01)
*H01L 21/56* (2006.01)
(Continued)

(52) U.S. Cl.
CPC ........ *H01L 21/67126* (2013.01); *B29C 45/34* (2013.01); *B29C 45/586* (2013.01); *B29C 45/63* (2013.01); *H01L 21/565* (2013.01)

(58) Field of Classification Search
CPC .... B29C 45/586; B29C 45/63; B29C 45/7653
See application file for complete search history.

(56) References Cited

U.S. PATENT DOCUMENTS

| 4,431,047 A | * | 2/1984 | Takeshima | ............. | B22D 17/14 164/253 |
| 4,714,423 A | * | 12/1987 | Hattori | .................... | B30B 11/26 425/376.1 |

(Continued)

FOREIGN PATENT DOCUMENTS

| JP | 08241901 A | * | 9/1996 | ....... B29C 45/14655 |
| JP | 09272132 A2 | | 10/1997 | |

(Continued)

*Primary Examiner* — Xiao S Zhao
*Assistant Examiner* — Emmanuel S Luk
(74) *Attorney, Agent, or Firm* — Muir Patent Law, PLLC

(57) ABSTRACT

A semiconductor package molding device is provided. The semiconductor package molding device includes a chamber lower part which comprises a lower mold configured to receive a molding target, a chamber upper part configured to engage with the chamber lower part to isolate the inside of a chamber from the outside of the chamber, the chamber upper part including an upper mold configured to form a cavity with the lower mold, a first vent hole located between the chamber upper part and the chamber lower part, the first vent hole configured to discharge gas from the inside of the cavity after the chamber upper part and the chamber lower part engage with each other, a pot which is formed in the lower mold in the chamber lower part, a plunger configured to push up a molding material in the pot, a second vent hole which is formed in a side surface of the pot in the chamber lower part and a cavity vacuum pump configured to discharge gas through the first vent hole and the second vent hole.

19 Claims, 13 Drawing Sheets

(51) Int. Cl.
*B29C 45/58* (2006.01)
*B29C 45/63* (2006.01)
*B29C 45/34* (2006.01)

(56) References Cited

U.S. PATENT DOCUMENTS

| | | | | |
|---|---|---|---|---|
| 5,082,615 | A * | 1/1992 | Sakai | B29C 45/02 257/E21.504 |
| 5,451,154 | A | 9/1995 | Schaars | |
| 5,460,502 | A * | 10/1995 | Majercak | B29C 45/586 425/116 |
| 5,626,887 | A * | 5/1997 | Chou | B29C 45/586 425/129.1 |
| 5,811,041 | A * | 9/1998 | Snow | B29C 45/63 264/102 |
| 5,846,477 | A * | 12/1998 | Hotta | B29C 45/14655 264/511 |
| 5,874,116 | A * | 2/1999 | Takano | B29C 45/34 425/542 |
| 5,997,783 | A * | 12/1999 | Hunter | B29C 44/588 264/276 |
| 6,267,577 | B1 * | 7/2001 | Nishi | B29C 45/02 257/E21.504 |
| 6,827,569 | B2 * | 12/2004 | Wieder | B22C 9/067 425/130 |
| 8,425,826 | B2 | 4/2013 | Venrooij | |
| 8,453,887 | B2 * | 6/2013 | Boehm | A61C 5/62 222/387 |
| 8,672,308 | B2 * | 3/2014 | Yoo | H01L 33/005 269/21 |
| 9,174,374 | B2 | 11/2015 | Peters et al. | |
| 2002/0020940 | A1 * | 2/2002 | Kiritani | H01L 24/97 264/272.15 |
| 2002/0025352 | A1 * | 2/2002 | Miyajima | B30B 5/02 425/89 |
| 2003/0003628 | A1 * | 1/2003 | Oga | H01L 21/6835 438/124 |
| 2008/0057626 | A1 * | 3/2008 | Kuratomi | H01L 24/97 438/117 |
| 2010/0242273 | A1 * | 9/2010 | Sugimoto | H05K 3/3415 29/841 |
| 2011/0127694 | A1 * | 6/2011 | Kurita | B29C 43/18 264/272.13 |
| 2012/0164759 | A1 * | 6/2012 | Yoo | H01L 33/0095 438/7 |
| 2017/0217062 | A1 * | 8/2017 | Bae | H01L 21/565 |
| 2018/0254198 | A1 * | 9/2018 | Maeda | H01L 21/565 |

FOREIGN PATENT DOCUMENTS

| | | |
|---|---|---|
| JP | 2001170959 A2 | 6/2001 |
| JP | 2003175535 A2 | 6/2003 |
| JP | 2004134607 A2 | 4/2004 |
| JP | 2014087998 A2 | 5/2014 |
| KR | 10-0443316 B1 | 8/2004 |
| KR | 10-1225001 B1 | 1/2013 |
| KR | 10-1397677 B1 | 5/2014 |
| KR | 10-2017-0055787 A | 5/2017 |
| KR | 10-2017-0056605 A | 5/2017 |
| KR | 10-1759491 B1 | 7/2017 |
| KR | 10-1770691 B1 | 8/2017 |

\* cited by examiner

SEMICONDUCTOR PACKAGE MOLDING DEVICE AND METHOD OF MANUFACTURING SEMICONDUCTOR DEVICE

This application claims priority under 35 USC § 119 to Korean Patent Application No. 10-2018-0101936, filed on Aug. 29, 2018, in the Korean Intellectual Property Office, the disclosure of which is incorporated hereby in its entirety by reference.

BACKGROUND

1. Field

The present disclosure relates to a semiconductor package molding device and a method of manufacturing a semiconductor device using the semiconductor package molding device.

2. Description of the Related Art

A molding process for molding a semiconductor chip is used in order to protect the semiconductor chip in manufacturing a semiconductor package. The molding process may be completed by placing a semiconductor package in a mold and injecting a molding material into the mold.

Here, the cavity inside the mold is kept in a vacuum to avoid a formation of voids during the molding process. The voids may cause problems such as extrusion of bumps in a subsequent process. For this reason, a venting method for maintaining the vacuum of the cavity and a sensing method for detecting air leaks are important.

SUMMARY

Aspects of the present disclosure provide a semiconductor package molding device for preventing the formation of voids.

However, the invention is not restricted to the embodiments set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package molding device. The semiconductor package molding device includes a chamber lower part which comprises a lower mold configured to receive a molding target, a chamber upper part configured to engage with the chamber lower part to isolate the inside of a chamber from the outside of the chamber, the chamber upper part including an upper mold configured to form a cavity with the lower mold, a first vent hole located between the chamber upper part and the chamber lower part, the first vent hole configured to discharge gas from the inside of the cavity after the chamber upper part and the chamber lower part engage with each other, a pot which is formed in the lower mold in the chamber lower part, a plunger configured to push up a molding material in the pot, a second vent hole which is formed in a side surface of the pot in the chamber lower part and a cavity vacuum pump configured to discharge gas through the first vent hole and the second vent hole.

According to another exemplary embodiment of the present disclosure, there is provided a semiconductor package molding device. The semiconductor package molding device includes a chamber lower part which comprises a lower mold comprising first and second molding grooves configured to receive first and second molding targets respectively, a chamber upper part configured to engage with the chamber lower part to isolate the inside of a chamber from the outside of the chamber, the chamber upper part including an upper mold configured to form a cavity in combination with the lower mold, a first vent hole which is located between the chamber upper part and the chamber lower part, the first vent hole configured to discharge air from the inside of the cavity after the chamber upper part and the chamber lower part engage with each other, a pot which is formed between the first and second molding grooves in a plan view in the chamber lower part, a plunger configured to push up a molding material in the pot, a second vent hole which is formed in a side surface of the pot in the chamber lower part, a cavity vacuum pump configured to discharge the air through the first vent hole and the second vent hole and a sensor configured to detect an air leak in the first vent hole and the second vent hole.

According to another exemplary embodiment of the present disclosure, there is provided a semiconductor package molding device. The semiconductor package molding device includes a chamber, a pot configured through which a molding material is injected into the chamber and a plunger configured to push up the molding material through the pot, the plunger configured to contact the molding material in the pot, a rod disposed under the plunger and configured to push up the plunger, a spring disposed under the rod and configured to push up the rod and the plunger, an internal suction hole which is formed in the plunger and the rod, a plunger suction hole which is formed in a side surface of the plunger in the pot and connects to the internal suction hole, a rod suction hole which is formed in a side surface of the rod and connects to the internal suction hole and a suction part configured to discharge air from the inside of the pot through the internal suction hole, the plunger suction hole and the rod suction hole.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a semiconductor device according to some embodiments will be described with reference to FIGS. 1 through 9.

Figure 1:
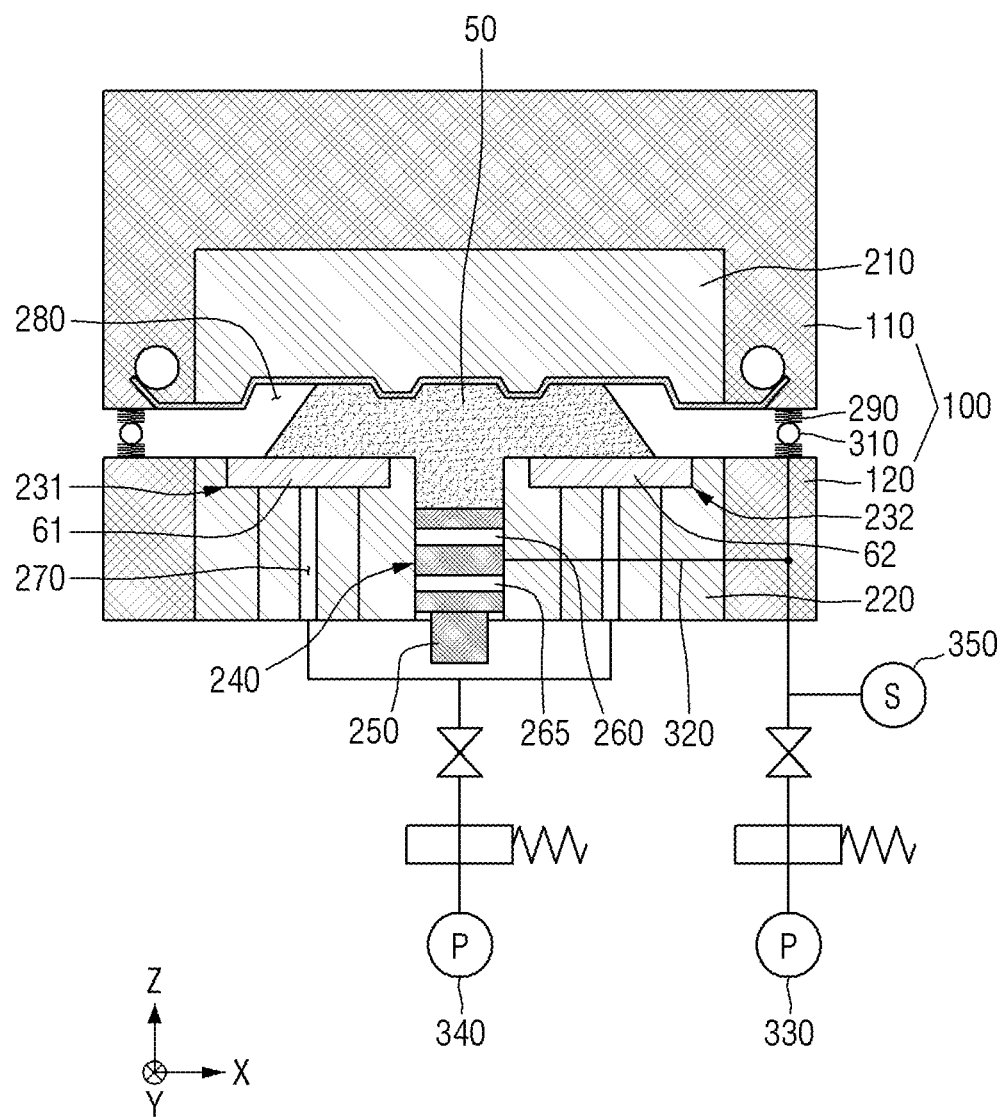
FIG. 1 is a conceptual diagram of a semiconductor package molding device according to some embodiments.

FIG. 1 is a conceptual diagram of a semiconductor package molding device according to some embodiments.

Referring to FIG. 1, a first direction X and a second direction Y may be directions intersecting each other among horizontal directions. For example, the first direction X and the second direction Y may be directions perpendicularly intersecting each other. A third direction Z may be a direction intersecting both the first direction X and the second direction Y. For example, the third direction Z may be a direction vertically orthogonal to the first direction X and second direction Y. Accordingly, the first direction X, the second direction Y and the third direction Z may be orthogonal to each other.

The semiconductor package molding device according to the embodiments includes a chamber 100, an upper mold 210, a lower mold 220, a cavity 280, a pot 240, a plunger 250, a sealing member 290, a vent hole 310, a first additional vent hole 320, a cavity vacuum pump 330, a molding groove vacuum pump 340, and a sensor 350.

The chamber 100 may include a housing that forms the exterior of the semiconductor package molding device of the present disclosure. For example, the chamber 100 may contain other components such as the upper mold 210 and the lower mold 220. The housing may isolate the inside of the chamber 100 from the outside of the chamber 100 and maintain the inside of the chamber 100 in a vacuum (unlike the outside of the chamber 100) when a molding process is performed inside the chamber 100.

The chamber 100 may include a chamber upper part 110 and a chamber lower part 120. The chamber upper part 110 may include the upper mold 210, and the chamber lower part 120 may include the lower mold 220. The chamber upper part 110 may be fixed, and the chamber lower part 120 may be coupled to or separated from the chamber upper part 110 as it moves up or down. However, the invention is not limited to this case. For example, in certain embodiments, the chamber lower part 120 may also be fixed while the chamber upper part 110 moves up and down, or both the chamber upper part 110 and the chamber lower part 120 may also move up and down.

A first molding target 61 and a second molding target 62 may be placed on the lower mold 220. When the chamber lower part 120 is coupled to the chamber upper part 110 in a state where the first molding target 61 and the second molding target 62 are placed on the lower mold 220, the cavity 280 may be formed between the lower mold 220 and the upper mold 210. Here, the first molding target 61 and the second molding target 62 may be semiconductor packages. This will be described in more detail later.

In certain embodiments, the lower mold 220 may include a first molding groove 231, a second molding groove 232, and fixing holes 270.

The first molding groove 231 may be a portion where the first molding target 61 is placed. The second molding groove 232 may be a portion where the second molding target 62 is placed. The first molding groove 231 and the second molding groove 232 may be spaced apart from each other in the first direction X.

The fixing holes 270 may be formed under the first molding groove 231 and the second molding groove 232, respectively. The fixing holes 270 may penetrate the lower mold 220. The fixing holes 270 may be used to fix the first molding target 61 and the second molding target 62 by the molding groove vacuum pump 340.

The cavity 280 may be a space between the upper mold 210 and the lower mold 220.

For example, the cavity 280 may be formed by a combination of the upper mold 210 and the lower mold 220. The cavity 280 may be a space in which a molding material 50 moves to be placed on the first molding target 61 and the second molding target 62. Since the molding material 50 has fluidity as the temperature rises, it fully fills the cavity 280 formed by the upper mold 210 and the lower mold 220 and is cured to become a mold film of each of the first molding target 61 and the second molding target 62.

The pot 240 may be formed between the first molding groove 231 and the second molding groove 232 in the first direction X, e.g., in a plan view. The pot 240 may be a hole extending in the third direction Z. The plunger 250 may be located inside the pot 240 and may move up and down inside the pot 240. The plunger 250 may contact the molding material 50 in the pot 240. As the plunger 250 moves up and down, the molding material 50 previously placed on the plunger 250 inside the pot 240 may be fed into the cavity 280 to mold the first molding target 61 and the second molding target 62. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). The term "contact," as used herein, refers to a direction connection (i.e., touching) unless the context indicates otherwise.

The molding material 50 may include, but is not limited to, an epoxy mold compound (EMC). The molding material 50 may be in a solid form inside the pot 240 and, as the temperature rises, may be liquefied to have fluidity. When the molding material 50 has fluidity, it is placed on the first molding target 61 and the second molding target 62 by the plunger 250 and then cured to mold the first molding target 61 and the second molding target 62.

The plunger 250 may move up and down within the pot 240. The plunger 250 may push the molding material 50 into the cavity 280 as it moves up. The plunger 250 has almost the same size as an inner wall of the pot 240, but a gap may exist between an outer surface of the plunger 250 and the inner wall of the pot 240.

Since the air inside the cavity 280 may leak through the gap, the plunger 250 may include a first ring 260. The first ring 260 and other rings described herein may be formed of a natural or synthetic nonporous material, for example, such as a Teflon ring. The first ring 260 may form an airtight barrier between the outer surface of the plunger 250 and the inner wall of the pot 240 to prevent the air from leaking. In certain embodiments, the first ring 260 may block the space between the outer surface of the plunger 250 and the inner wall of the pot 240 to prevent the air inside the cavity 280 from leaking, e.g. through the pot 240. The "air" described herein may refer to a gas used in the semiconductor package molding process described throughout the disclosure, and may or may not include atmospheric air. For example, the gas may include nitrogen gas.

Like the first ring 260, a second ring 265 may also form an airtight barrier between an outer surface of the plunger 250 and an inner wall of the pot 240 to prevent the air inside the cavity 280 from leaking. In certain embodiments, a second ring 265 may also block the space between the outer surface of the plunger 250 and the inner wall of the pot 240 to prevent the air inside the cavity 280 from leaking, e.g., through a gap between the outer surface of the plunger 250 and the inner wall of the pot 240. The second ring 265 will be described in more detail later.

The sealing member 290 may be positioned between the chamber upper part 110 and the chamber lower part 120. The sealing member 290 may be disposed at a position where the chamber upper part 110 and the chamber lower part 120 engage with each other. For example, the chamber upper part 110 and the chamber lower part 120 may be physically connected with each other through the sealing member 290. The sealing member 290 may seal a portion where the chamber lower part 120 and the chamber upper part 110 engage with each other, except for the vent hole 310. For example, the vent hole 310 may be positioned in an interface/boundary of the chamber upper part 110 and the chamber lower part 120.

The volume of the sealing member 290 may be varied (reduced/expanded) depending on the applied force. This may enable the sealing member 290 to efficiently perform sealing and venting. For example, the sealing member 290 may be formed of an elastic/flexible material, e.g., rubber or polytetrafluoroethylene (PTFE) (e.g. Teflon).

The vent hole 310 may be formed adjacent to the sealing member 290. In certain embodiments, the vent hole 310 may penetrate the sealing member 290. The vent hole 310 may be disposed between the chamber upper part 110 and the chamber lower part 120 at a position where the chamber upper part 110 and the chamber lower part 120 engage with each other. Through the vent hole 310, the air inside the cavity 280 may be removed.

For example, the vent hole 310 may be connected to the cavity vacuum pump 330 to discharge the air from the inside of the cavity 280 to the outside.

The first additional vent hole 320 may be formed in an outer wall of the pot 240. Like the vent hole 310, the first additional vent hole 320 may be connected to the cavity vacuum pump 330. The first additional vent hole 320 may discharge the air between the pot 240 and the plunger 250 disposed inside the pot 240 to the outside.

The first additional vent hole 320 may be disposed in the outer wall of the pot 240 at a position between the first ring 260 and the second ring 265 of the plunger 250. Since the plunger 250 moves up and down in the pot 240, a section between the first ring 260 and the second ring 265 of the plunger 250 may also move up and down. The first additional vent hole 320 may be located between the first ring 260 and the second ring 265 even though the plunger 250 moves up and down. For example, the first additional vent hole 320 may be positioned lower than the lowest position of the first ring 260 and may be higher than the highest position of the second ring 265 while the plunger 250 moves up and down within the pot 240. For example, the first ring 260 may be configured to move up and down within a first region of the pot, and the additional vent hole 320 may be located below the first region.

The cavity vacuum pump 330 may be connected to both the vent hole 310 and the first additional vent hole 320 so as to discharge air to the outside. For example, the air confined inside the cavity 280 may be discharged to the outside through the vent hole 310, and the air confined inside the pot 240 may be discharged to the outside through the first additional vent hole 320.

The molding groove vacuum pump 340 may be connected to the fixing holes 270 so as to fix the first molding target 61 and the second molding target 62 respectively placed in the first molding groove 231 and the second molding groove 232. For example, the first molding target 61 and the second molding target 62 may be attached by suction to bottom surfaces of the first molding groove 231 and the second molding groove 232 by the fixing holes 270 formed under the first molding groove 231 and the second molding groove 232, respectively.

The sensor 350 may be connected to the vent hole 310 and the first additional vent hole 320. The sensor 350 may sense the pressure of the first additional vent hole 320 to detect air leaks in the pot 240. The first ring 260 may seal the space between the pot 240 and the plunger 250 to maintain the vacuum of the cavity 280.

However, as the up and down movement of the plunger 250 is repeatedly performed, the first ring 260 may be worn, causing air to flow into the cavity 280 through the gap between the plunger 250 and the pot 240, e.g., between the first ring 260 and a side wall of pot 240.

Therefore, the second ring 265 may seal the pot 240 against the wear of the first ring 260, and the sensor 350 may detect the inflow of air due to the wear of the first ring 260. When the sensor 350 detects the air inflow, the first ring 260 may be replaced, thereby improving the reliability of the molding process.

Figure 2:
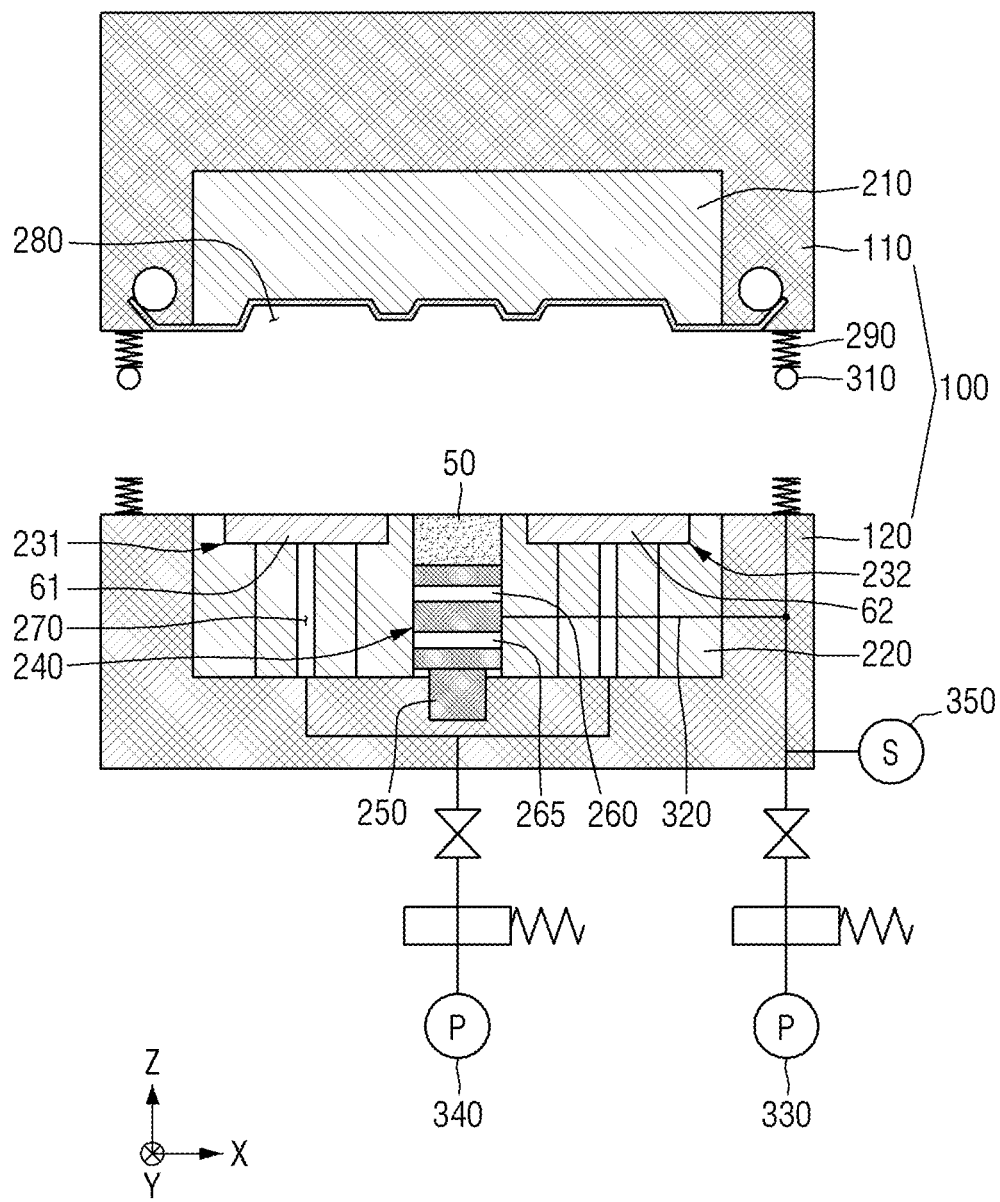
FIG. 2 is a conceptual diagram illustrating the separated state of a chamber of FIG. 1.
Figure 3:
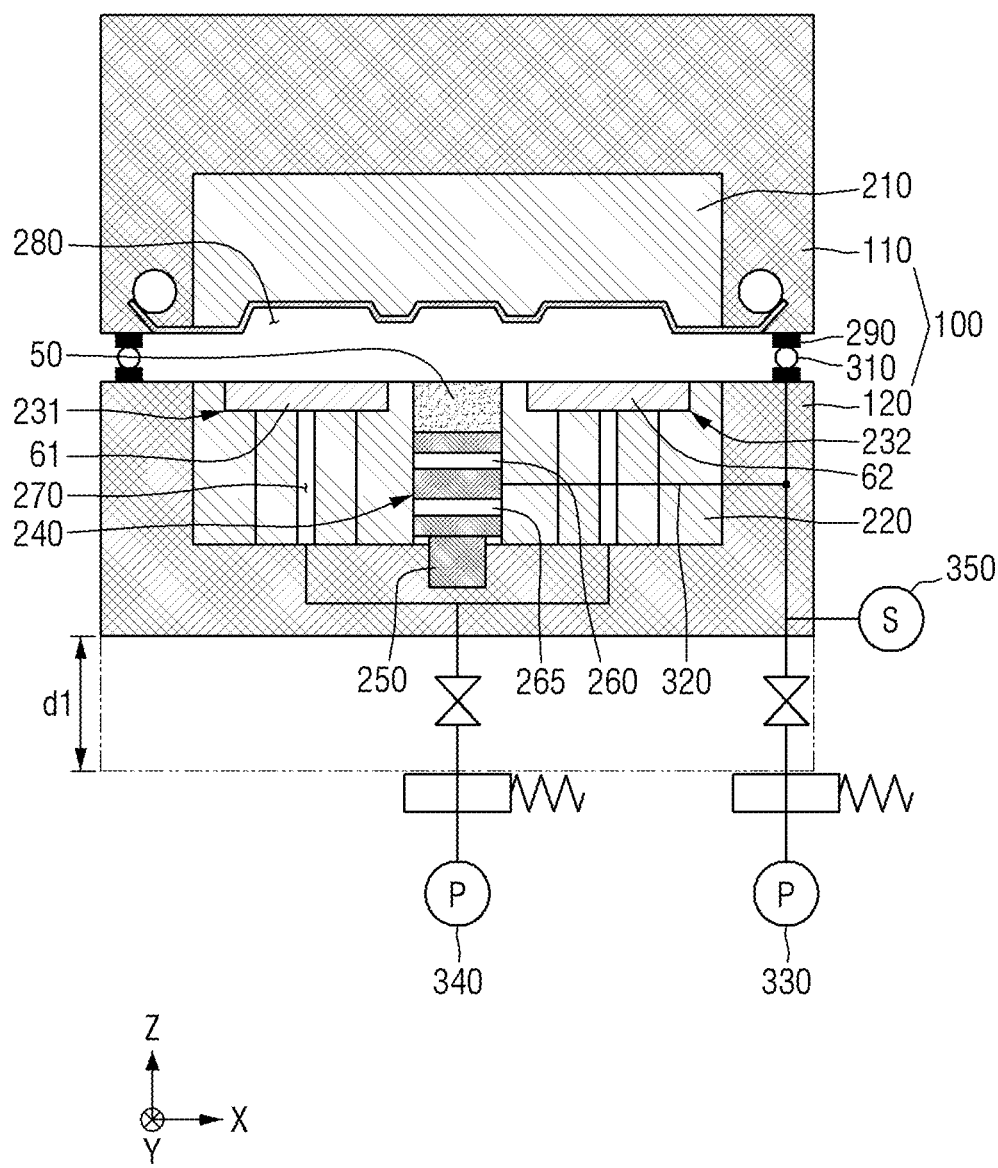
FIG. 3 is a conceptual diagram illustrating the transition of the chamber of FIG. 1 from the separated state to the coupled state.

FIG. 2 is a conceptual diagram illustrating the separated state of the chamber 100 of FIG. 1, and FIG. 3 is a conceptual diagram illustrating the transition of the chamber 100 of FIG. 1 from the separated state to the coupled state.

Referring to FIGS. 2 and 3, the chamber upper part 110 and the chamber lower part 120 may be coupled to each other in a state where they are separated from each other. For example, the chamber upper part 110 and the chamber lower part 120 may be combined to form the cavity 280 between the chamber upper part 110 and the chamber lower part 120. The volume of the sealing member 290 may be larger when the chamber upper part 110 and the chamber lower part 120 are separated from each other than when the chamber upper part 110 and the chamber lower part 120 are coupled to each other. For example, the sealing member 290 may shrink when the chamber upper part 110 and the chamber lower part 120 are combined, and the sealing member 290 may expand when the chamber upper part 110 and the chamber lower part 120 are separated from each other. Here, the molding material 50 may be positioned in a solid state on the plunger 250 inside the pot 240.

For example, when the inside of the chamber 100 is not isolated from the outside of the chamber 100, venting, e.g., a process of forming a vacuum in the chamber 100 may not be performed. For example, the venting may be performed after the cavity 280 is isolated from the outside of the chamber 100.

The volume of the sealing member 290 may be reduced when the chamber lower part 120 is moved up together with the lower mold 220 by a first distance d1 in the third direction Z to engage with the chamber upper part 110. For example, the first distance d1 may be a distance between a bottom of the chamber lower part 120 and a top of the springs 420 which will be described below with respect to FIG. 6. At this time, the inside of the chamber 100 may be isolated from the outside of the chamber 100, except for the vent hole 310 and the first additional vent hole 320.

Figure 4:
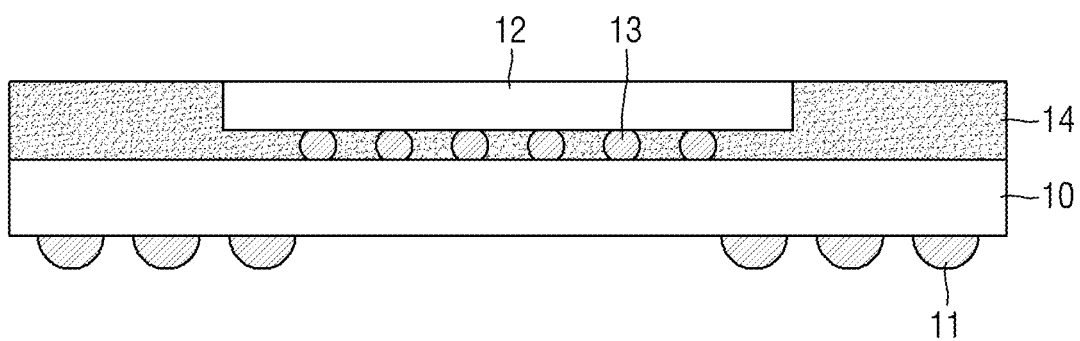
FIG. 4 is a conceptual diagram of a first molding target of FIG. 1.

FIG. 4 is a conceptual diagram of the first molding target 61 of FIG. 1. The second molding target 62 may have the same or similar shape as the first molding target 61, but a description of the second holding target 62 will be omitted for the sake of convenience.

Referring to FIG. 4, the first molding target 61 may include a substrate 10, solder balls 11, a chip 12, micro bumps 13, and a mold film 14.

The substrate 10 may be a printed circuit board (PCB). Although not illustrated, a wiring structure for electrically connecting an upper surface and a lower surface of the substrate 10 may be provided in the substrate 10. For example, the wiring structure electrically connecting the upper surface and the lower surface of the substrate may be a through via, and the through via may electrically connect an electric device or an electric circuit formed on the upper surface of the substrate 10 with an electric device or an electric circuit formed on the lower surface of the substrate 10.

The solder balls 11 may be located on the lower surface of the substrate 10. The solder balls 11 may be in the form of conductor balls and used for electrical connection of the semiconductor package and other structures (e.g., electric circuits or devices).

The chip 12 may be stacked on the substrate 10. The chip 12 may be, but is not limited to, an application processor (AP) chip or a memory chip. For example, the AP chip may be a mobile application processor used in a cellular phone. For example, AP chip may be a microprocessor used in a mobile phone.

The micro bumps 13 may electrically connect the chip 12 and the substrate 10. The micro bumps 13 may be a plurality of conductor bump structures.

The mold film 14 may be formed on the upper surface of the substrate 10, side surfaces of the chip 12, and a lower surface of the chip 12. The mold film 14 may be formed by a semiconductor package molding device according to the embodiments.

As a gap, e.g., between the micro bumps 13, in which the mold film 14 of the semiconductor package should be formed is reduced, the possibility of forming voids may be increased when the vacuum in the cavity 280 is not properly maintained.

A void formed between the bump balls may cause a bump extrusion phenomenon in which the bump balls are connected to each other along the surface of the void as they are melted in a heat treatment process such as a reflow process. In this case, the bump balls that are intended to be insulated from each other may short-circuit, thereby greatly reducing the reliability of the semiconductor package.

Therefore, in order to prevent this problem, the semiconductor package molding device according to the embodiments may include the first additional vent hole 320 to maintain vacuum in the pot 240 against the wear of the first ring 260 and may detect the inflow of air using the sensor 350.

Accordingly, the reliability of the semiconductor package molding device may be improved according to the current embodiments.

The structure of the first molding target 61 of FIG. 4 is an example, and the invention is not limited to this example. For example, a molding target of the semiconductor package molding device according to the embodiments may have various structures and may be subject to molding, such as a package on package (POP) structure and a POP structure with an inserted interposer (i-POP).

Figure 5:
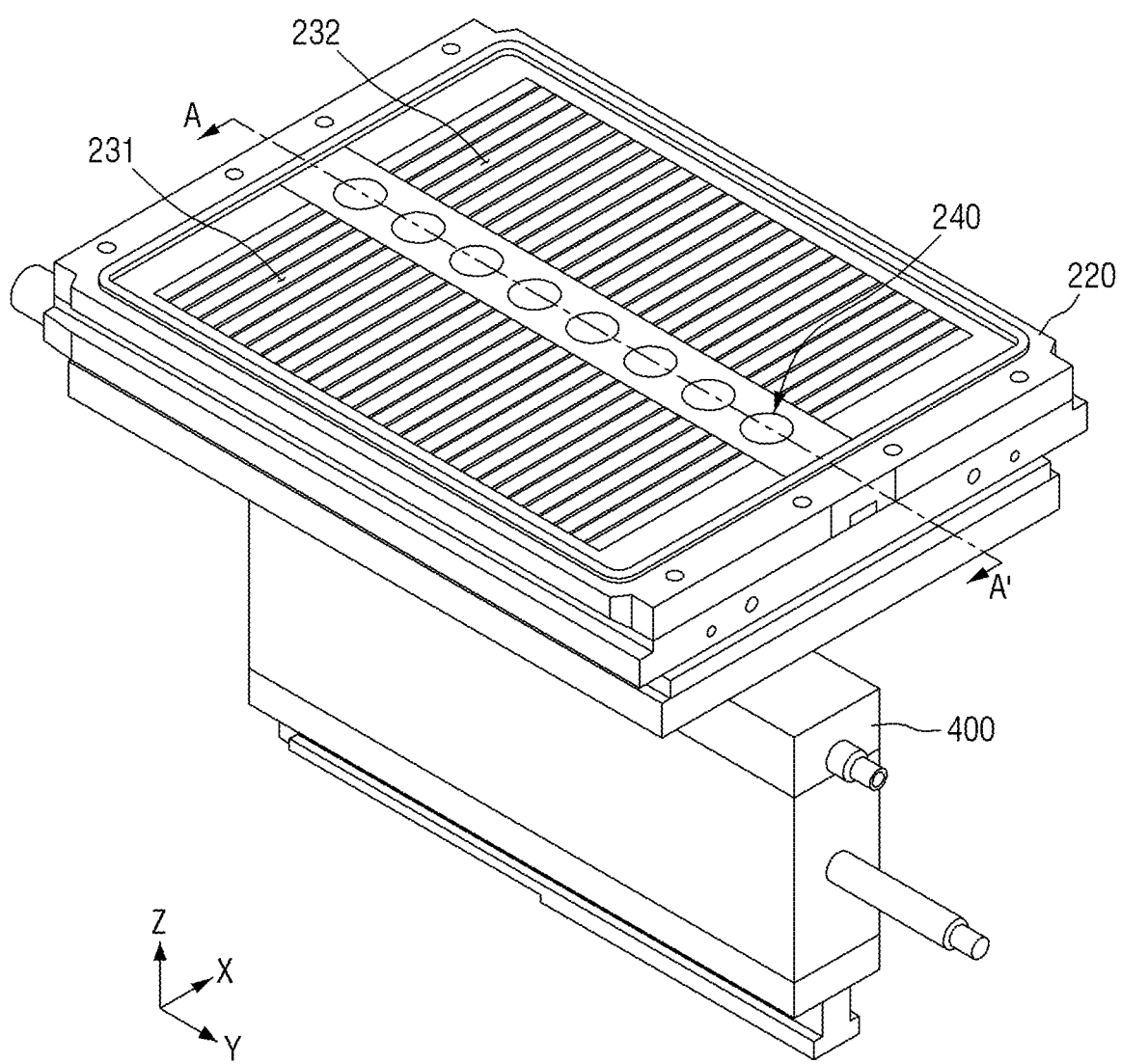
FIG. 5 is a perspective view of a lower mold and a plunger unit of the semiconductor package molding device of FIG. 1.

FIG. 5 is a perspective view of the lower mold 220 and a plunger unit 400 of the semiconductor package molding device of FIG. 1. In FIG. 5, the chamber lower part 120 is not illustrated for the sake of convenience.

Referring to FIG. 5, the semiconductor package molding device according to the embodiments further includes the plunger unit 400.

The plunger unit 400 may include a plurality of plungers 250. The plunger unit 400 may be disposed under the lower mold 220 to drive the plungers 250 upward and downward.

The lower mold 220 may include a plurality of pots 240. The pots 240 may be spaced apart from each other and aligned in the second direction Y. Each of the first molding groove 231 and the second molding groove 232 may extend in the lower mold 220 along the second direction Y. Here, extending in the second direction Y may denote that a direction in which long sides are formed among long and short sides is the second direction Y. For example, each of the first molding groove 231 and the second molding groove 232 may include a plurality of sub-grooves as shown in FIG. 5. For example, each of the sub-grooves may extend to the first direction X as shown in FIG. 5.

The first molding groove 231 and the second molding groove 232 may be spaced apart from each other in the first direction X. The pots 240 may be positioned between the first molding groove 231 and the second molding groove 232. The plungers 250 may be disposed inside the pots 240, respectively. As the plungers 250 move in the third direction Z, the molding material 50 disposed in the pots 240 may move to both sides, that is, toward the first molding groove 231 and the second molding groove 232, thereby performing molding.

The plunger unit 400 disposed under the lower mold 220 may move the plungers 250 in the third direction Z.

Figure 6:
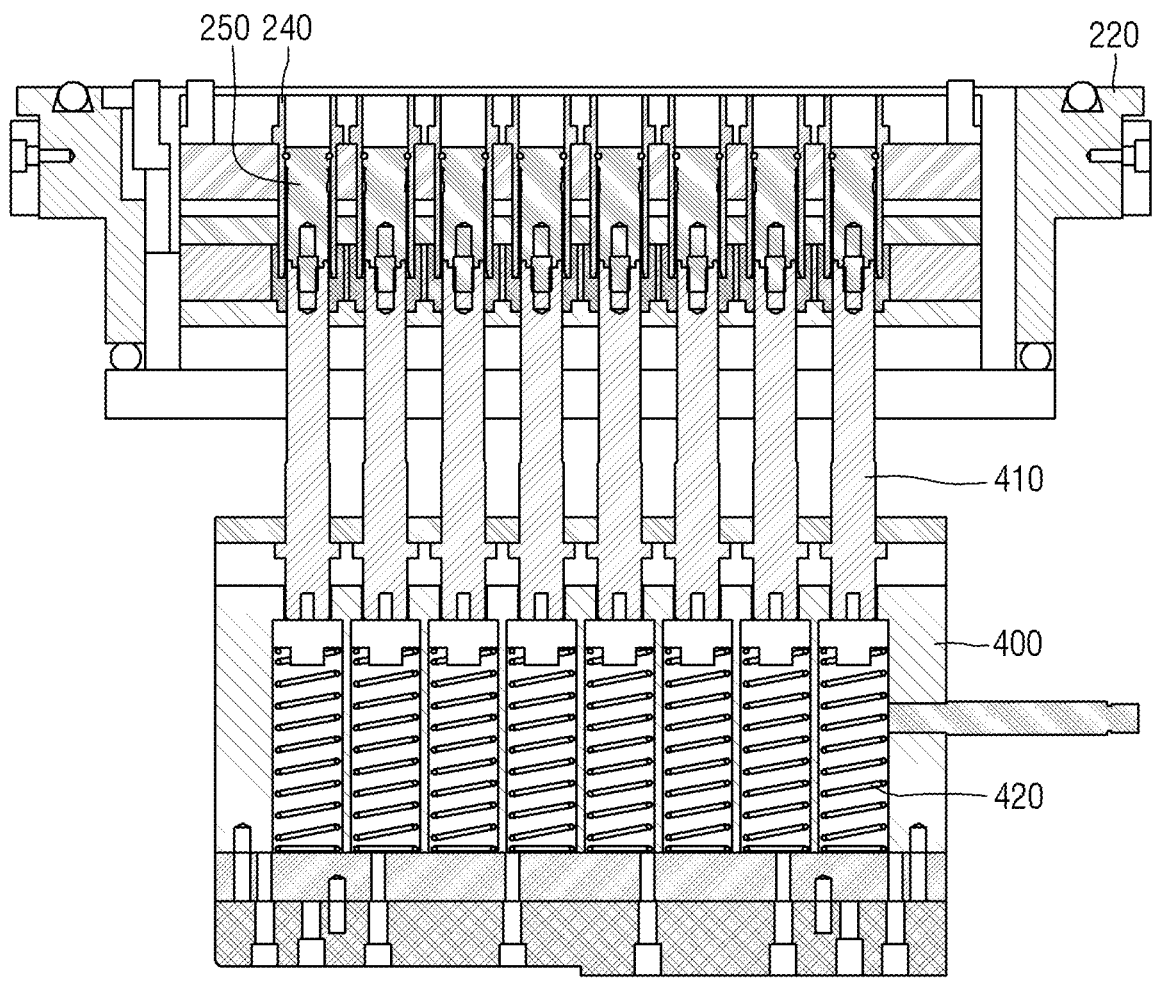
FIG. 6 is a cross-sectional view taken along line A-A' of FIG. 5.

FIG. 6 is a cross-sectional view taken along line A-A' of FIG. 5.

Referring to FIG. 6, the plunger unit 400 may include the plungers 250, rods 410, and springs 420.

The plungers 250 may be portions for pushing the molding material 50 inside the pots 240 in the third direction Z as described above.

The rods 410 may be disposed under the plungers 250 and respectively coupled to the plungers 250. The rods 410 may extend/move in the third direction Z to induce the movement of the plungers 250 in the third direction Z. For example, the springs 420 may expand and shrink to move the rods 410 up and down in the third direction Z.

The springs 420 may be disposed under the rods 410 and push the rods 410 upward in the third direction Z. Accordingly, the rods 410 may move in the third direction Z, and the plungers 250 may also move in the third direction Z at the same time as the rods 410 move up, causing the molding material 50 of FIG. 1 to move to the cavity 280 of FIG. 1.

Like the plungers 250, the rods 410 and the springs 420 may be provided in plural numbers. A plurality of rods 410 and a plurality of springs 420 may be spaced apart from each other and aligned in the second direction Y.

In FIGS. 5 and 6, the numbers of the pots 240, the plungers 250, the rods 410, and the springs 420 are all eight. However, the invention is not limited to this case. For example, the semiconductor package molding device according to certain embodiments may include seven or less pots 240, plungers 250, rods 410 and springs 420 or may include nine or more pots 240, plungers 250, rods 410 and springs 420.

Figure 7:
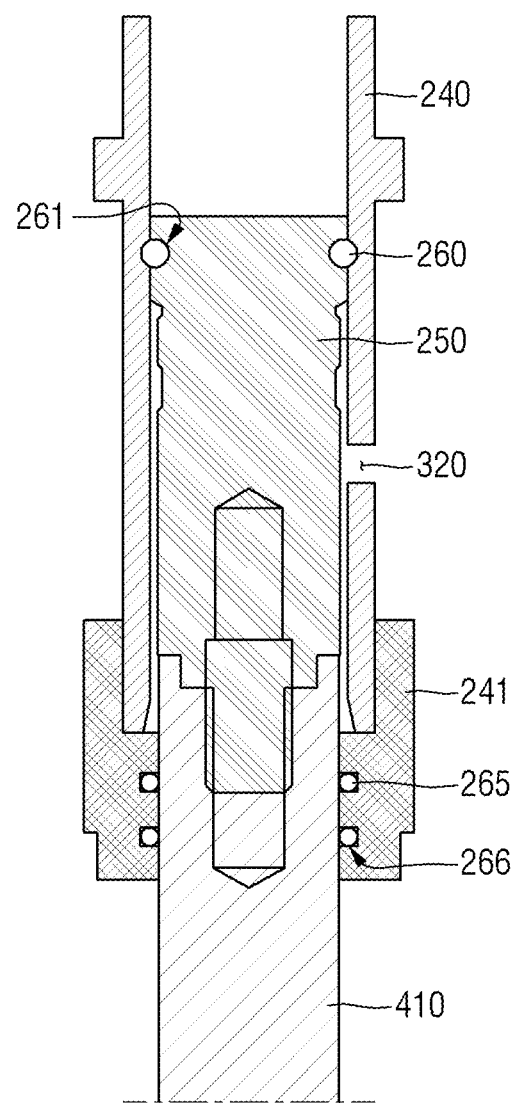
FIG. 7 is a cross-sectional view illustrating a pot and a plunger of FIG. 6 in detail.

FIG. 7 is a cross-sectional view illustrating a pot 240 and a plunger 250 of FIG. 6 in detail.

Referring to FIG. 7, the semiconductor package molding device according to the embodiments may further include a pot seal 241.

The pot 240 may include a first ring groove 261 in its inner wall. The first ring groove 261 may be a portion where a first ring 260 is formed. For example, the first ring 260 may be disposed in the first ring groove 261 to seal a space between the inner wall of the pot 240 and the plunger 250.

The pot seal 241 may be coupled to a lower part of the pot 240 and guide a rod 410 and the plunger 250 to be properly inserted into the pot 240. The pot seal 241 may be formed of, but is not limited to, a Teflon material.

The rod 410 may include second ring grooves 266 on its outer surface. Second rings 265 may be formed in the second ring grooves 266. For example, the second rings 265 may be disposed in the second ring grooves 266 to seal a space between an inner wall of the pot seal 241 and the rod 410.

The second rings 265 may be O-rings. The second rings 265 may include at least one of, but not limited to, polyetheretherketone (PEEK), silicon, and urethane.

The second rings 265 may be provided in plural numbers. However, the invention is not limited to this case. For example, only one second ring 265 may be provided in certain embodiments.

Since the second rings 265 are formed in the pot seal 241, they may be resistant to heat and contamination.

A first additional vent hole 320 may be formed in an outer wall of the pot 240. The first additional vent hole 320 may be positioned between the first ring 260 and the second rings 265 in the third direction Z. For example, air may be sucked into the first additional vent hole 320 so as to prevent the inflow of air when the first ring 260 is worn.

Figure 8:
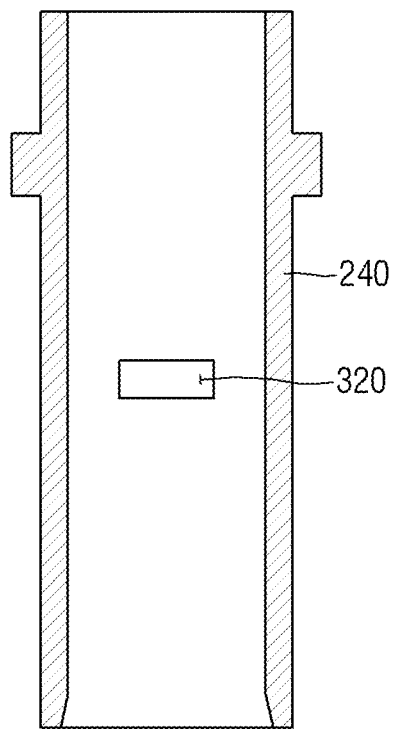
FIG. 8 is a cross-sectional view illustrating the shape of a first additional vent hole of FIG. 7 in detail.

FIG. 8 is a cross-sectional view illustrating the shape of the first additional vent hole 320 of FIG. 7 in detail.

Referring to FIG. 8, the first additional vent hole 320 in the pot 240 may be quadrangular, e.g., in a side view. The first additional vent hole 320 may have a shape formed by removing a part of the outer wall of the pot 240. Air may be discharged through the first additional vent hole 320 by the cavity vacuum pump 330.

Figure 9:
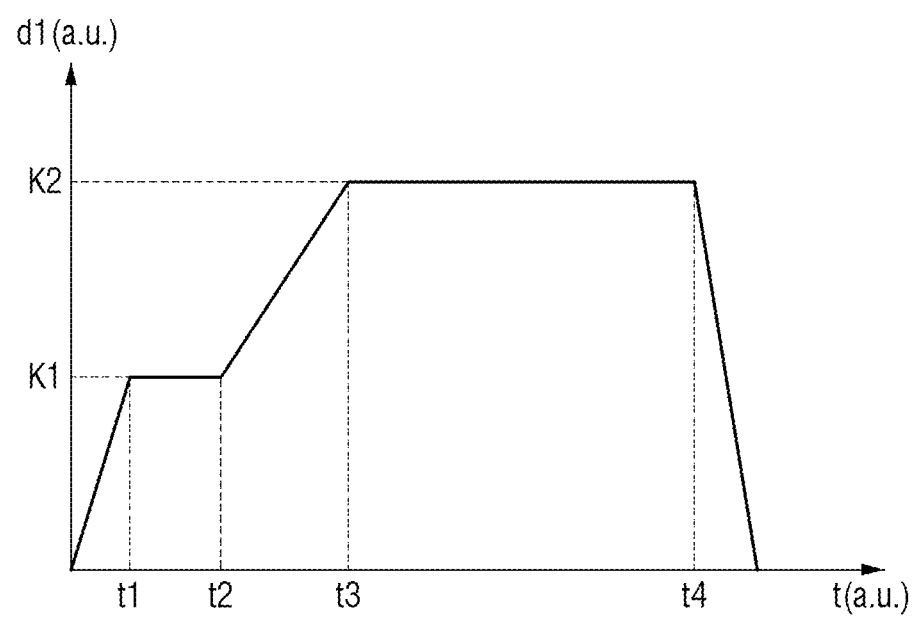
FIG. 9 is a graph for explaining the chamber coupling and venting operations of the semiconductor package molding device of FIG. 1.

FIG. 9 is a graph for explaining the chamber coupling and venting operations of the semiconductor package molding device of FIG. 1.

Referring to FIGS. 2, 3 and 9, in the chamber 100 (e.g.) of the semiconductor package molding device according to the embodiments, the chamber upper part 110 and the chamber lower part 120 may be combined/coupled through a plurality of stages, e.g., through a multiple steps. The horizontal axis of FIG. 9 represents time, and the vertical axis represents the first distance d1 of FIG. 3.

Until a first time t1, the first distance d1 may reach a first reference distance K1 at a constant speed. At the first time t1, the chamber upper part 110 and the chamber lower part 120 of the chamber 100 may already be engaged with each other. Here, the entire chamber 100 except for the vent hole 310 may be sealed by the sealing member 290.

From the first time t1 to a second time t2, the first distance d1 may not increase, and the force with which the chamber upper part 110 and the chamber lower part 120 engage may be kept constant at a first force. At this time, the cavity vacuum pump 330 may suck/discharge the air from the inside of the cavity 280 through the vent hole 310 and the first additional vent hole 320.

The first distance d1 may constantly increase to a second reference distance K2 from the second time t2 to a third time t3. At this time, although the chamber lower part 120 and the chamber upper part 110 have already met, the first distance d1 may increase as the volume of the sealing member 290 is reduced.

From the third time t3 to a fourth time t4, the first distance d1 may not increase, and the force with which the chamber upper part 110 and the chamber lower part 120 engage may be kept constant at a second force greater than the first force. At this time, the cavity vacuum pump 330 may also suck/discharge the air from the inside of the cavity 280 through the vent hole 310 and the first additional vent hole 320.

Since the volume of the sealing member 290 from the first time t1 to the second time t2 is larger than the volume of the sealing member 290 from the third time t3 to the fourth time t4, the size of the vent hole 310 from the first time t1 to the second time t2 may also be larger than the size of the vent hole 310 from the third time t3 to the fourth time t4.

For example, venting by the vent hole 310 from the first time t1 to the second time t2 may be easier than venting by the vent hole 310 from the third time t3 to the fourth time t4. Therefore, the sensor 350 may detect air leakage and inflow between the first time t1 and the second time t2. The air leakage and inflow detection of the sensor 350 may be relatively inefficient from the third time t3 to the fourth time t4 as compared with from the first time t1 to the second time t2. A vacuum rate in the cavity 280 between the first time t1 and the second time t2 may be faster than a vacuum rate in the cavity 280 between the third time t3 and the fourth time t4 and/or a pressure of the cavity pump 330 between the first time t1 and the second time t2 may be lower than the pressure of the cavity pump 330 between the third time t3 and the fourth time t4. For example, the amount of air removed from the cavity 280 between the first time t1 and the second time t2 may be greater that the amount of air removed from the cavity 280 between the third time t3 and the fourth time t4.

The semiconductor package molding device according to the current embodiments may block the flow of air into the pot 240 using the second rings 265 even when the first ring 260 is worn and may maintain the vacuum in the cavity 280 by discharging the air between the first ring 260 and the second rings 265 through the first additional vent hole 320.

Accordingly, this may prevent the creation of voids in the mold film 14, thereby greatly improving the reliability of the entire semiconductor package. For example, by removing air from the cavity 280 and from the pot 240, therefore maintaining vacuum in the cavity 280, void defect in the mold film 14 may be avoided or improved.

A semiconductor package molding device according to some embodiments will now be described with reference to FIG. 10. A description of elements and features identical to those of the above-described embodiments will be given briefly or omitted.

Figure 10:
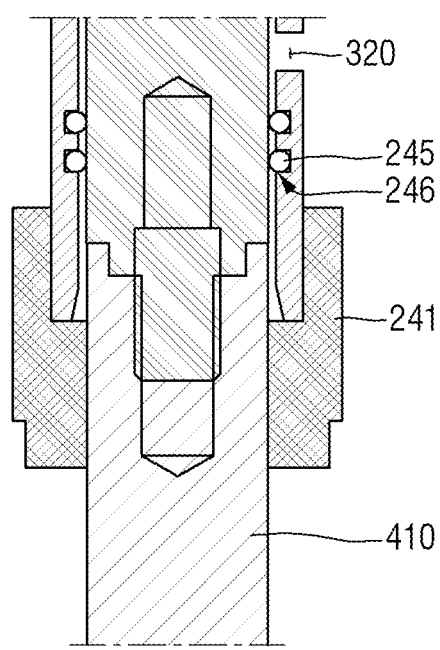
FIG. 10 is a cross-sectional view of a semiconductor package molding device according to some embodiments.
Figure 10:
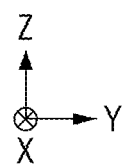

FIG. 10 is a cross-sectional view of a semiconductor package molding device according to some embodiments.

Referring to FIG. 10, the semiconductor package molding device according to the embodiments includes pot second rings 245 and pot second ring grooves 246.

The pot second ring grooves 246 may be formed in an inner wall of a pot 240. The pot second ring grooves 246 may be provided in plural numbers. However, the invention is not limited to this case, and only one pot second ring groove 246 may also be provided in certain embodiments. Although two pot second ring grooves 246 are illustrated in FIG. 10, the invention is not limited to this case. For example, the number of the pot second ring grooves 246 may also be three or more.

The pot second rings 245 may be located in the pot second ring grooves 246. Since the pot second rings 245 are located on the inner wall of the pot 240 rather than in a pot seal 241, they can more tightly prevent the flow of air into the pot 240 in relation to a first ring 260.

Since the pot 240 is made of a more rigid material than that of the pot seal 241, the degree of sealing between the pot second rings 245 and a plunger 250 may be increased.

For example, the semiconductor package molding device according to the current embodiments may better perform a vacuum process, thereby improving the reliability of a semiconductor package itself.

A semiconductor package molding device according to some embodiments will now be described with reference to FIG. 11. A description of elements and features identical to those of the above-described embodiments will be given briefly or omitted.

Figure 11:
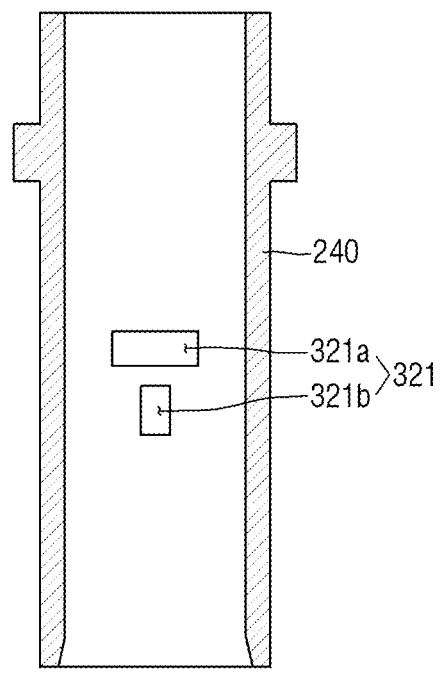
FIG. 11 is a cross-sectional view of a semiconductor package molding device according to some embodiments.

FIG. 11 is a cross-sectional view of a semiconductor package molding device according to some embodiments.

Referring to FIG. 11, the semiconductor package molding device according to the embodiments includes a second additional vent hole 321.

The second additional vent hole 321 may include a $(2-1)^{th}$ additional vent hole 321a and a $(2-2)^{th}$ additional vent hole 321b. The $(2-1)^{th}$ additional vent hole 321a may be formed above the $(2-2)^{th}$ additional vent hole 321b.

The shapes and sizes of the $(2-1)^{th}$ additional vent hole 321a and the $(2-2)^{th}$ additional vent hole 321b may be the same or different from each other. As illustrated in FIG. 11, the $(2-1)^{th}$ additional vent hole 321a and the $(2-2)^{th}$ additional vent hole 321b may have different shapes. The $(2-1)^{th}$ additional vent hole 321a and the $(2-2)^{th}$ additional vent hole 321b may also have the same shape.

Since the semiconductor package molding device according to the current embodiments includes a plurality of additional vent holes, it can more properly block the flow of air into a pot 240. Accordingly, the reliability of a semiconductor package (i.e., a molding target) on which a molding process is performed may be improved.

A semiconductor package molding device according to some embodiments will now be described with reference to FIG. 12. A description of elements and features identical to those of the above-described embodiments will be given briefly or omitted.

Figure 12:
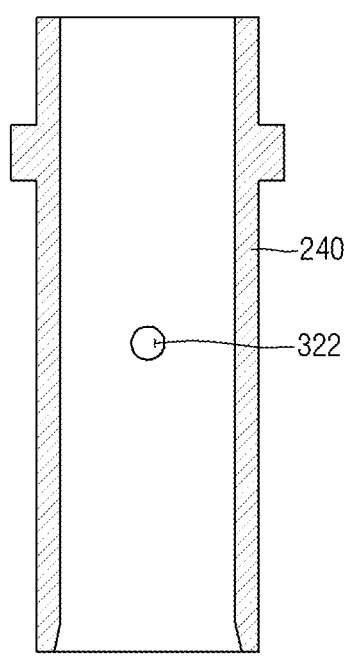
FIG. 12 is a cross-sectional view of a semiconductor package molding device according to some embodiments.

FIG. 12 is a cross-sectional view of a semiconductor package molding device according to some embodiments.

Referring to FIG. 12, the semiconductor package molding device according to the embodiments includes a third additional vent hole 322.

The third additional vent hole 322 may be circular. Since a pot 240 is a space in which a plunger 250 repeatedly moves up and down, the durability of the pot 240 may be important. If the shape of an additional vent hole is a polygon such as a quadrangle, cracks may be formed at vertices.

For example, in the case of a quadrangle, cracks may be formed at one or more of the four vertices. Once cracks are formed, they may gradually grow, leading to a significant reduction in the durability of the pot 240. Accordingly, the durability of the entire semiconductor package molding device may be significantly reduced, e.g., by a crack formed on the pot 240.

Therefore, the semiconductor package molding device of the current embodiments may include the third additional vent hole 322 formed in a circular shape in order to easily maintain the vacuum inside the pot 240 while preventing damage to the pot 240 as much as possible.

A semiconductor package molding device according to some embodiments will now be described with reference to FIG. 13. A description of elements and features identical to those of the above-described embodiments will be given briefly or omitted.

Figure 13:
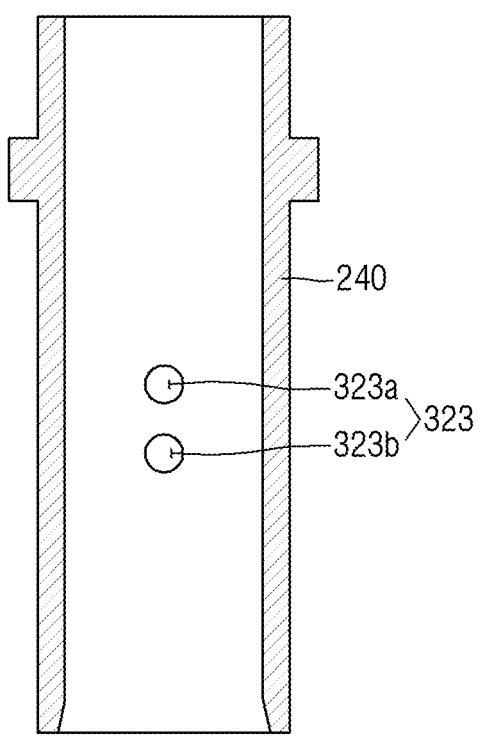
FIG. 13 is a cross-sectional view of a semiconductor package molding device according to some embodiments.

FIG. 13 is a cross-sectional view of a semiconductor package molding device according to some embodiments.

Referring to FIG. 13, the semiconductor package molding device according to the embodiments includes a fourth additional vent hole 323.

The fourth additional vent hole 323 may include a $(4-1)^{th}$ additional vent hole 323a and a $(4-2)^{th}$ additional vent hole 323b. The $(4-1)^{th}$ additional vent hole 323a may be formed above the $(4-2)^{th}$ additional vent hole 323b.

The sizes and shapes of the $(4-1)^{th}$ additional vent holes 323a and the $(4-2)^{th}$ additional vent holes 323b may be the same or different from each other. For example, although the $(4-1)^{th}$ additional vent hole 323a and the $(4-2)^{th}$ additional vent hole 323b have the same shape as illustrated in FIG. 13, they may also have different shapes.

The $(4-1)^{th}$ additional vent hole 323a and the $(4-2)^{th}$ additional vent hole 323b may each be circular. A circular additional vent hole may be relatively less likely to crack than a polygonal additional vent hole. For example, by using the circular additional vent hole, it is possible to easily maintain the vacuum inside the pot 240 while preventing damage to a pot 240 as much as possible.

Since the semiconductor package molding device according to the current embodiments includes a plurality of circular additional vent holes, it can more properly block the flow of air into the pot 240 while maintaining the durability of the pot 240. Accordingly, the reliability of a semiconductor package (i.e., a molding target) on which a molding process is performed may be improved.

A semiconductor package molding device according to some embodiments will now be described with reference to FIGS. 14 and 15. A description of elements and features identical to those of the above-described embodiments will be given briefly or omitted.

Figure 14:
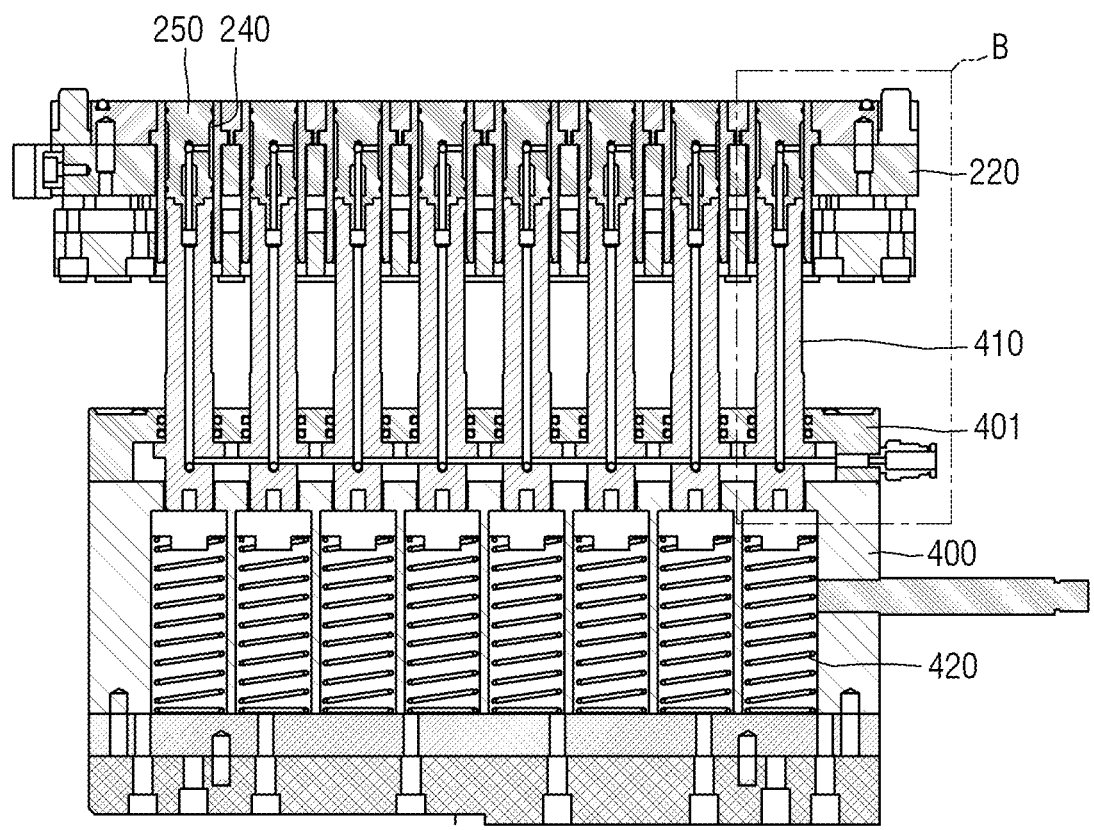
FIG. 14 is a cross-sectional view of a semiconductor package molding device according to some embodiments.
Figure 15:
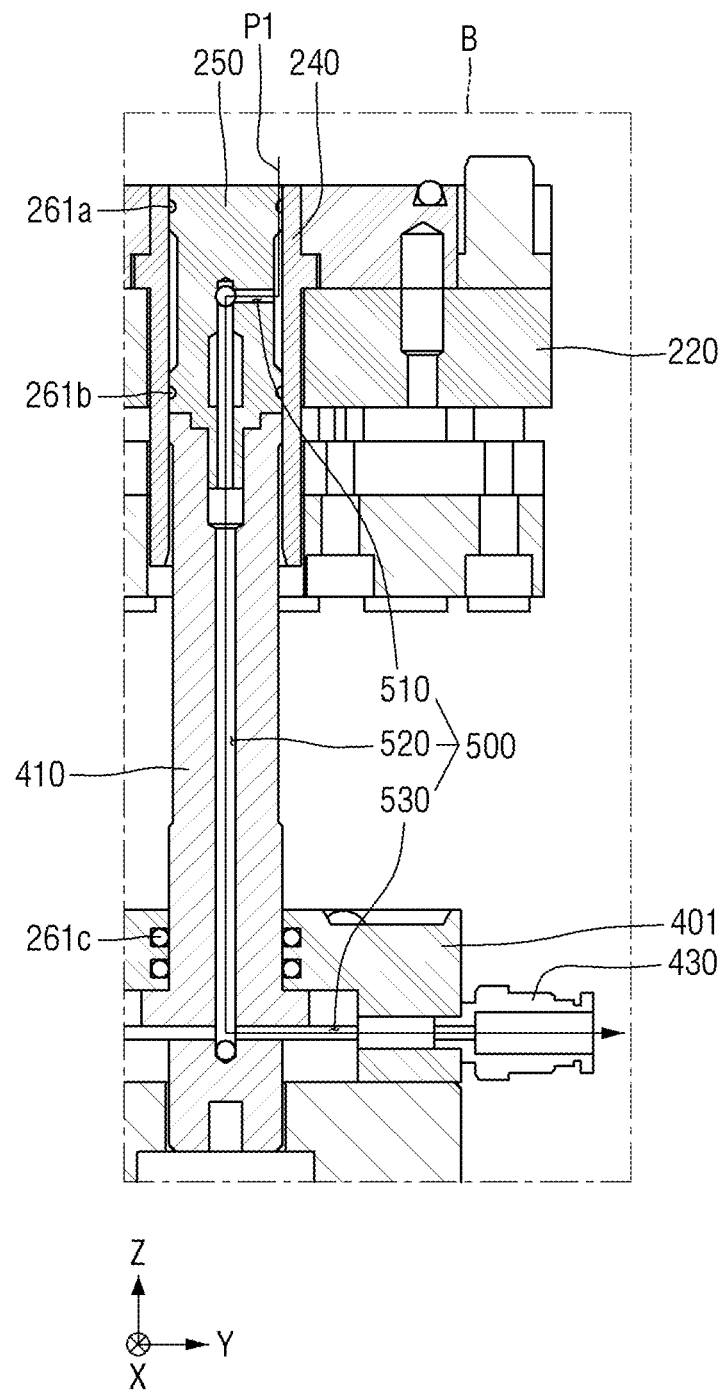
FIG. 15 is an enlarged cross-sectional view of a portion B of FIG. 14.

FIG. 14 is a cross-sectional view of a semiconductor package molding device according to some embodiments, and FIG. 15 is an enlarged cross-sectional view of a portion B of FIG. 14.

Referring to FIGS. 14 and 15, the semiconductor package molding device according to the embodiments includes a first blocking ring 261a, a second blocking ring 261b, third blocking rings 261c, a suction hole 500, and a suction part 430.

The first blocking ring 261a may block a space between an outer surface of a plunger 250 and an inner wall of a pot 240 to prevent the air inside a cavity 280 from leaking below the first blocking ring 261a toward the pot 240.

The second blocking ring 261b may be located below the first blocking ring 261a. The second blocking ring 261b may also block the space between the outer surface of the plunger 250 and the inner wall of the pot 240 to prevent the air inside the cavity 280 from leaking below the second blocking ring 261b.

The third blocking rings 261c may be located below the first blocking ring 261a and the second blocking ring 261b. The third blocking rings 261c may be positioned between a rod 410 and an outer wall 401 of a plunger unit 400. The third blocking rings 261c may block a space between the rod 410 and the outer wall 401 of the plunger unit 400 to prevent air from being introduced into the plunger unit 400.

The suction hole 500 may discharge the air from the inside of the pot 240 through the suction part 430. The suction hole 500 may include a plunger suction hole 510, an internal suction hole 520, and a rod suction hole 530.

The plunger suction hole 510 may be used to discharge the air from the inside of the pot 240 into the plunger 250. Although the plunger suction hole 510 extends in the second direction Y in the drawings, it may extend in the first direction X or another horizontal direction.

The plunger suction hole 510 may be located between the first blocking ring 261a and the second blocking ring 261b. Therefore, even when the first blocking ring 261a is worn, the inflow of air can be properly blocked.

The internal suction hole 520 may extend from the plunger suction hole 510. The internal suction hole 520 may extend in the third direction Z in the plunger 250 and the rod 410.

The internal suction hole 520 may discharge the air coming/sucked through the plunger suction hole 510 toward the rod suction hole 530.

The rod suction hole 530 may discharge the air from the inside of the internal suction hole 520 through the suction part 430. Although the rod suction hole 530 extends in the second direction Y in the drawings, it may extend in the first direction X or another horizontal direction.

The suction part 430 may penetrate the outer wall 401 of the plunger unit 400 and suck/discharge the air through the suction hole 500. Through this process, the air disposed inside the pot 240 can be properly removed.

For example, the air disposed inside the pot 240 may be discharged through the suction hole 500 and the suction part 430 along a first path P1.

In a plurality of plungers 250 and a plurality of rods 410, plunger suction holes 510 and internal suction holes 520 may be formed as separate holes. However, rod suction holes 530 may all be connected and extend to the suction part 430.

Therefore, a plurality of suction holes 500 can efficiently discharge air through one suction part 430.

Hereinafter, a method of manufacturing a semiconductor device will be described according to an embodiment of the present disclosure.

First, a substrate may be provided. The substrate may be a semiconductor substrate like a silicon wafer or a germanium substrate, but the invention is not limited to these substrates. Various circuit may be formed on the substrate. The various circuits may be formed by a plurality of photolithography and other processes. After the various circuits are formed, the substrate may be diced into a plurality of chips. The plurality of chips may be provided to a semiconductor package molding device described above according to various embodiments of the present disclosure to form a mold frame 14 on each of the plurality of chips as described with respect to FIG. 4. Micro bumps 13 may be formed on a surface of each chip before the chip is provided to the semiconductor package molding device as shown in FIG. 4.

While the present inventive concept has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor package molding device comprising:
a chamber lower part which comprises a lower mold configured to receive a molding target;
a chamber upper part configured to engage with the chamber lower part to isolate the inside of a chamber from the outside of the chamber, the chamber upper part including an upper mold configured to form a cavity with the lower mold;
one or more first vent holes located between the chamber upper part and the chamber lower part at an outer side surface between the chamber upper part and the chamber lower part, the one or more first vent holes configured to discharge gas from the inside of the cavity after the chamber upper part and the chamber lower part engage with each other;
a pot which is formed in the lower mold in the chamber lower part;
a plunger configured to push up a molding material in the pot;
a second vent hole which is formed in a side surface of the pot in the chamber lower part;
a cavity vacuum pump configured to discharge gas through the one or more first vent holes and the second vent hole; and
a sealing member which is located between the chamber upper part and the chamber lower part and configured to block a space between the chamber upper part and the chamber lower part, excluding the one or more first vent holes,
wherein the one or more first vent holes are formed in the sealing member, and
wherein the sealing member is a flexible member configured to change its shape.

2. The molding device of claim 1, further comprising:
a groove which is formed in a side surface of the plunger; and
a first ring which is engaged with the groove.

3. The molding device of claim 2, wherein the first ring is configured to move up and down within a first region of the pot, and the second vent hole is located below the first region.

4. The molding device of claim 2, further comprising a second ring which is disposed under the second vent hole to seal the inside of the pot.

5. The molding device of claim 4, further comprising:
a rod which is disposed under the plunger and coupled to the plunger and configured to move up and down to move the plunger up and down; and
a pot seal which is coupled to a lower part of the pot and configured to guide the rod and the plunger into the pot, wherein the second ring is located between an inner wall of the pot seal and the rod.

6. The molding device of claim 4, wherein the second ring is located between the pot and the plunger.

7. The molding device of claim 1, further comprising a sensor configured to detect gas leak in the one or more first vent holes and the second vent hole, wherein the one or more first vent holes are formed in an interface between the chamber upper part and the chamber lower part.

8. A semiconductor package molding device comprising:
a chamber lower part which comprises a lower mold comprising first and second molding grooves configured to receive first and second molding targets respectively;
a chamber upper part configured to engage with the chamber lower part to isolate the inside of a chamber from the outside of the chamber, the chamber upper part including an upper mold configured to form a cavity in combination with the lower mold;
one or more first vent holes which is located between the chamber upper part and the chamber lower part at an outer side surface between the chamber upper part and the chamber lower part, the one or more first vent holes configured to discharge air from the inside of the cavity after the chamber upper part and the chamber lower part engage with each other;
a pot which is formed between the first and second molding grooves in a plan view in the chamber lower part;
a plunger configured to push up a molding material in the pot; a second vent hole which is formed in a side surface of the pot in the chamber lower part;
a cavity vacuum pump configured to discharge the air through the one or more first vent holes and the second vent hole; and
a sensor configured to detect an air leak in the one or more first vent holes and the second vent hole;
a sealing member which is located between the chamber upper part and the chamber lower part and configured to block a space between the chamber upper part and the chamber lower part, excluding the one or more first vent holes,
wherein the one or more first vent holes are formed in the sealing member, and
wherein the sealing member is attached to a bottom surface of the chamber upper part and a top surface of the chamber lower part.

9. The molding device of claim 8, wherein the second vent hole is circular in a cross-sectional view.

10. The molding device of claim 8, further comprising a third vent hole formed in the side surface of the pot in the chamber lower part.

11. The molding device of claim 8, wherein the chamber lower part and the chamber upper part are configured to be engaged with multiple steps in which the chamber lower part and the chamber upper part engage with a first force in a first step and the chamber lower part and the chamber upper part engage with a second force greater than the first force in a second step, wherein the sealing member has a smaller volume in the second step than a volume in the first step.

12. The molding device of claim 11, wherein the molding device is so configured that an amount of air removed by the cavity vacuum pump is greater in the first step than an amount of air removed in the second step.

13. The molding device of claim 11, wherein the sensor is configured to detect an air leak in the first step.

14. A semiconductor package molding device comprising:
a chamber;
a first pot configured through which a molding material is injected into the chamber;
a first plunger configured to push up the molding material through the first pot, the first plunger configured to contact the molding material in the first pot;
a first rod disposed under the first plunger and configured to push up the first plunger;
a first spring disposed under the first rod and configured to push up the first rod and the first plunger;
a first internal suction hole which is formed in the first plunger and the first rod;
a first plunger suction hole which is formed in a side surface of the first plunger in the first pot and connects to the first internal suction hole; a first rod suction hole which is formed in a side surface of the first rod and connects to the first internal suction hole; and a suction part configured to discharge air from the inside of the first pot through the first internal suction hole, the first plunger suction hole and the first rod suction hole.

15. The molding device of claim 14, further comprising:
a second pot spaced apart from the first pot;
a second plunger corresponding to the second pot;
a second rod corresponding to the second plunger; and
a second spring corresponding to the second rod.

16. The molding device of claim 15, further comprising a second plunger suction hole corresponding to the second plunger;
a second rod suction hole corresponding to the second rod; and
a second internal suction hole corresponding to the second rod.

17. The molding device of claim 16, wherein the first and second rod suction holes are connected to each other.

18. The molding device of claim 17, wherein the chamber comprises a chamber upper part and a chamber lower part which are configured to be separated and then engaged with each other.

19. The molding device of claim 18, further comprising a vent hole which is located between the chamber upper part and the chamber lower part.

* * * * *